United States Patent [19]

Evans

[11] 4,017,138

[45] Apr. 12, 1977

[54] SUBSTRATE CONNECTOR

[75] Inventor: Robert Franklin Evans, New Cumberland, Pa.

[73] Assignee: E. I. Du Pont de Nemours and Company, Wilmington, Del.

[22] Filed: June 16, 1975

[21] Appl. No.: 587,228

[52] U.S. Cl. .......................... 339/75 MP; 339/91 R; 339/176 MP

[51] Int. Cl.$^2$ ..................... H05K 1/07; H01R 13/54

[58] Field of Search ...... 339/75 MP, 91 R, 176 MP

[56] References Cited

UNITED STATES PATENTS

| | | | |
|---|---|---|---|
| 3,216,580 | 11/1965 | Fricker | 339/75 MP |
| 3,234,499 | 2/1966 | Paholek | 339/176 MP |
| 3,329,926 | 7/1967 | Aksu | 339/75 MP |
| 3,683,317 | 8/1972 | Walkup | 339/176 MP |

FOREIGN PATENTS OR APPLICATIONS

| | | | |
|---|---|---|---|
| 885,040 | 12/1961 | United Kingdom | 339/75 MP |

*Primary Examiner*—Roy Lake
*Assistant Examiner*—Mark S. Bicks

[57] ABSTRACT

An electrical connector for a substrate including a housing having a base, an elongated channel and a plurality of cantilever contacts mounted in the base extending into the channel, and a member operatively mounted in the channel having a base including an aperture receiving each contact mounted in the base of the insulating housing. Inter-engaging latch arms on the housing and member provide for zero insertion force loading of the substrate in the member in a loading position. A cam surface in each aperture cams each contact into engagement with a conductive pad on the substrate and provides a wiped, graduated force electrical connection when the substrate and member are operatively engaged in the housing in a loaded position and the substrate, member and housing are secured by the inter-engaging latch arms on the member and housing.

7 Claims, 3 Drawing Figures

SUBSTRATE CONNECTOR

BACKGROUND OF THE INVENTION

1. Field of the Invention

This invention relates to electrical connectors and particularly relates to electrical connectors for removably receiving a substrate and electrically connecting a plurality of contact terminals with conductive pads along an edge of the substrate.

2. Description of the Prior Art

A connector for receiving edges of a substrate having contacts and detachably engaging circuit path terminations along an edge of the substrate is described in U.S. Pat. No. 3,671,813. A radio tube adapter including a cam-actuated cantilever contact is described in U.S. Pat. No. 2,738,483. U.S. Pat. No. 2,857,577 describes an electrical connector having a base including a spring clip member disposed therein and a U-shaped member having an elongated slot for receiving a circuit panel adapted for engagement with the outer part of the spring clip to move the spring member laterally to establish heavy contact pressure. A connector for a printed circuit edge board comprising an insulation block having forward and rearward ends, a bore in the block opening through the forward end defined in part by vertically opposite, parallel spaced-apart walls and an elongated spring wire terminal mounted in the bore in the insulation block is described in U.S. Pat. No. 3,329,926. A pressure block including a passage for free reception of the circuit board is moved rearwardly against the forward end of the terminal members to increase a bow in the terminals and cause a pressure contact. U.S. Pat. No. 3,705,085 describes plug and socket connectors having two parts movable toward and away from each other, the second part having an abutment surface for engagement with a package body so that when the package body and the second part abut during the insertion of the terminal into the cavity, further movement of the cavity causes a contact to establish an electrical connection between a terminal and a contact.

The connectors in the above-mentioned prior art patents do not positively mechanically secure the substrate in the connector, but rely on the high-pressure electrical contact for mechanically retaining the substrate in the connector. Under repeated vibration or mechanical shock, the substrate can work loose from the high-pressure contact and without separate mechanical constraint, the electrical connection between the contacts and the conductive pads can be disrupted. It is generally known in the prior art to provide card guides and racks having separate mechanical latching mechanisms independent of the connector. The connector of the present invention provides integral mechanical latching for the substrate. The connector is particularly useful where the equipment, in which the connector and substrate are ultimately used, is subject to repeated vibration or mechanical shock, e.g. use in mobile, airborne or shipboard electronic equipment.

SUMMARY OF THE INVENTION

According to the present invention, an electrical connector is provided for receiving a substrate having a plurality of conductive pads on a surface adjacent an edge thereof. The connector comprises a first housing including a base having a pair of upstanding walls forming a channel, a plurality of cantilever contacts mounted in the base of the housing extending into the channel, and a member for receiving the substrate operatively mounted in the channel including a base having an aperture including an interior cam surface medially receiving each contact, a surface on the base for receiving the edge of the substrate having the conductive pads on an adjacent surface; the housing and the member operatively mounted therein having interengaging latch arms for operatively engaging the member in the housing in a loading position for receiving the substrate with zero contact insertion force and for operatively engaging the substrate and member in the housing in a loaded position by engaging the cam surface in each aperture in the base to flex each contact and provide a graduated-force, wiped electrical connection between a contact surface and each conductive pad on the substrate.

Preferably, the inter-engaging latch arms comprise a releasable latch arm mounted on each end of the base of the housing between each wall, each latch arm including a latching surface extending from a side away from the channel and a latch release member on the free end of each arm. The member, operatively mounted in the housing preferably includes an insulating member extending from the base between each aperture and a pair of insulating end members at each end of the base, the insulating members and end members having coplanar, vertical surfaces spaced from an edge of the base to support the substrate when an edge is engaged with the surface of the base. It is preferred that each latch arm on the base comprise a medially-mounted pivotal arm on each end member, each arm having a first free end extending toward the base including a latch surface for engaging the latch surface on the latch arm on the base of the housing, and a second free end extending away from the base having a latch surface for engaging an edge of the substrate away from the base.

Preferably, each latch arm medially mounted on each insulating end member includes a pair of side members connected to a medial cross-member and a cross-member at each free end of each latch arm. The free end of the latch arm extending toward the base preferably has a latch surface inwardly directed on each side member toward the base for engaging a latch surface on each end of a wall of the channel in the first housing for operatively mounting the member in a loading position for receiving a substrate. A second latch surface on the cross member between the side members engages a latching surface on each releasable latch arm at each end of the base of the first housing when the insulating member is operatively engaged in the insulation housing and each contact is electrically engaged with a conductive pad on the substrate. The cross-member on each free end of the latch arm preferably includes a latch surface and a recess in the cross-member and latch surface in vertical alignment with the surface on the base of the member for receiving an edge of the substrate.

In addition to the positive mechanical latching of the substrate in the connector, the connector of the present invention provides zero insertion force between each contact surface and each conductive pad on the substrate when the substrate is inserted in the member in a loading position and a wiped, graduated force electrical contact when the insulating member and substrate are operatively engaged in a loaded position in the insulating housing. The releasable latch arms on the insulation housing provide for readily releasing the member and the electrical connection between the contacts and the conductive pads on the substrate. On release, the cantilever spring contacts urge the insulating member to return to the loading position. The substrate may be readily removed from the latch arms which mechanically secure the substrate in the insulating member in the loaded position.

DETAILED DESCRIPTION OF A PREFERRED EMBODIMENT

Figure 1:
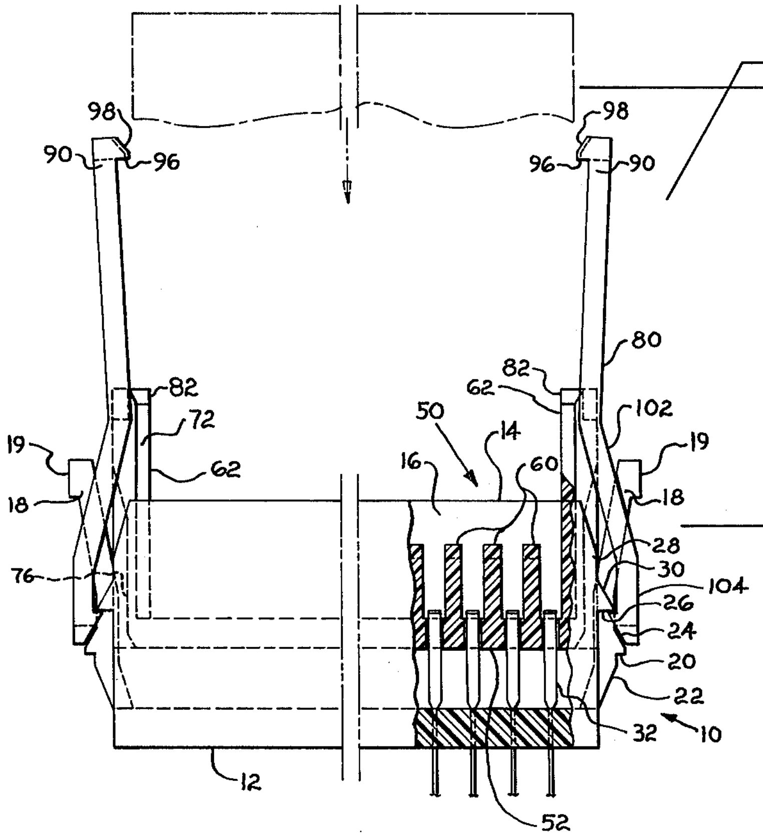
FIG. 1 is a front elevation view in partial section of a preferred embodiment of a connector according to the invention.

A preferred embodiment of a connector of the present invention is illustrated in the attached drawings wherein the same numerals are used throughout the various figures to illustrate the same elements.

A unitary insulating housing 10 comprises a base 12, a pair of upstanding longitudinal walls 14 defining a longitudinal channel 16 and a pair of releasable latch arms 18 extending outwardly between walls 14 from each end of the base 12. Each latch arm 18 includes a latch surface 20 extending from an outer side 22 of each arm 18. A cam surface 24 is formed opposite each latch surface 20. A latch surface 26 is formed on each end 28 of each wall 14. Latch surface 26 is spaced from latch surface 20 away from base 12 of the housing 10. A cam surface 30 is formed opposite each latch surface 26.

A plurality of contacts 32 are mounted in the base 12. Each contact 32 has a terminal end 34 mounted in and extending through the bottom of the base 12. A cantilever contact arm 36 extends from terminal end 34 into the channel 16. Each contact arm 36 includes an outwardly-bowed medial portion 38 and a contact portion 40 including a contact surface 42 and an outwardly-flared free end 44. A raised stop member 46 is provided on an interior surface of one of the walls 14 of channel 16.

A unitary insulating member 50 for receiving a substrate comprises a base 52 having a plurality of apertures 54, a plurality of insulating members 60 extending from the base between each aperture, and a pair of insulating end members 62. Each aperture 54 includes an interior cam surface 56. The insulating members 60 have coplanar surfaces 66 recessed from an edge 68 of base 52. Surfaces 66 are vertical with respect to base 52 and are also co-planar with a recessed surface 72 in each insulating end member 62. The recessed surfaces 66 and 72 provide a surface 64 on the base 52 adjacent an edge 68 of the base 52. Each insulating end member 62 includes an outwardly-facing, U-shaped channel 76 of graduated depth having spaced side walls 78. The graduated U-shaped channel 76 has a maximum epth at the bottom of base 52. A latch arm 80 is medially mounted to the end 82 of each insulating member away from base 52. Each latch arm 80 comprises a pair of side members 84 joined by a medial cross-member 86 at the end 82 of each insulating end member 62, a cross-member 88 between the ends 90 of side members 84 extending away from the base 52, and a cross member 92 between ends 94 of side members 84 extending toward the base 52. Each cross member 88 includes a latch surface 96 extending between each end 90 of each side member 84. A cam surface 98 is formed opposite each latch surface 96. A shallow recess 100 is provided in each cross member 88 in vertical alignment with surface 64 on base 52. Side members 84 extending away from the base 12 are inclined away from insulating end member 62 and each other. Side members 84 extending toward the base include divergent inclined segments 102 and parallel segments 104. A latch surface 106 co-extensive with each side member 84 and inwardly directed is provided on each end 94 of each side member 84. A latch surface 108 is provided on each cross-member 96 between each pair of side members 84 a spaced distance toward end 94 of side members 84. A coplanar cam surface 110 is formed opposite latch surfaces 106, 108.

With particular reference to FIG. 1, the connector is illustrated in a loading position for receiving a substrate and described below. Insulating member 50 is operatively mounted in insulation housing 10 with contact arms 36 received in apertures 54. Each latch surface 106 on each side member 84 of each latch arm 80 is engaged with each latch surface 26 on each end 28 of each wall 14 of the housing 10. The cam surface 56 of each aperture 54 engages the bowed section 38 of each contact arm 36 away from the base 12 of housing 10. The contact arms 36 urge the insulating member 50 away from base 52 of housing 10 with latch surfaces 106, 26 engaged. The contact surfaces 42 of each contact 32 are spaced inwardly from surfaces 66 of the insulating members 60 between adjacent apertures 54.

A substrate S having conductive pads P along a surface thereof adjacent one edge is inserted vertically in the insulating member 50 between recesses 100 in cross-member 88 in vertical alignment with surface 64 on base 52 of the member 50. Coplanar surfaces 66 and 72 and the opposing interior surface of wall 14, support the substrate S in a vertical position with respect to base 52 of member 50 and base 12 of housing 10. In the loading position, each contact surface 42 is spaced from the conductive pads P on a surface of the substrate S adjacent the edge of surface 64 of base 52 of member 50, and base 52 of member 50 is spaced from base 12 of housing 10 a first spaced distance. There is no contact pressure between contact surfaces 42 and the conductive pads when the substrate is inserted in the insulating member 50 in the loading position.

Figure 3:
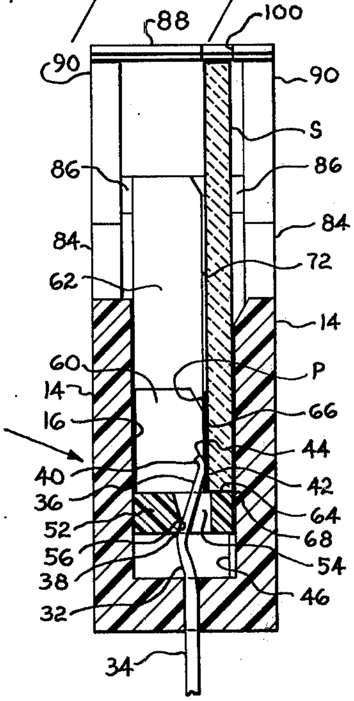
FIG. 3 is a side elevation view taken along line 3—3 of FIG. 1.
Figure 2:
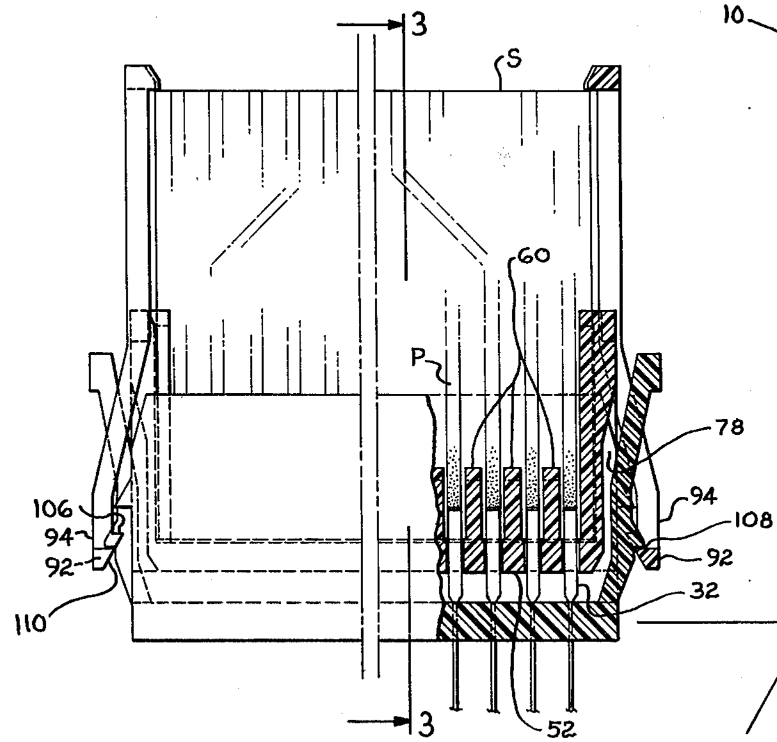
FIG. 2 is a view similar to FIG. 1 including a substrate loaded in the connector.

With particular reference to FIGS. 2 and 3 illustrating the substrate and insulating member 50 loaded in the connector, the substrate and member are operatively engaged in a loaded position by pressing the edge of the substrate S between ends 90 of each latch arm 80. The opposite edge of the substrate in engagement with surface 64 operatively engages insulating member 50, and each cam surface 56 in each aperture 54 engages the outward bow 38 and deflects the contact arm 36 towards the pad P on the surface of the substrate S. Each contact surface 42 on each contact arm 36 is brought into engagement with each conductive pad P on the substrate. Each contact surface 36 and each pad P are wiped to clean any oxides from their respective surfaces with a graduated contact force being applied until the insulating member 50 and substrate are engaged in the loaded position in the insulating housing 10 with base 52 a second spaced distance from base 12.

As the insulating member 50 and substrate S are loaded, each graduated U-shaped channel 76 on the outside of each insulating end member 62 receives each releasable latch arm 18 at each end of the base 12. The cam surface 24 on each latch arm 18 engages the cam surface 110 on cross-member 92 between ends 94 of side members 84 of the latch arm 80. Cam surfaces 24, 119 cam the latch arms apart and the latch surface 108 on each latch arm 80 over-rides the latch surface 24 on each latch arm 18. The latch arms 80 flex inwardly to engage each latch surface 108 with each latch surface 20 securing the insulating member 50 in substrate S in the loaded position in housing 10. The stop member 46 stops engagement of base 52 in channel 16 beyond the loaded position and prevents the apertures 54 from over-riding the outward bow 38 of contact 32 and overstressing the contacts 32. Each end 90 of each latch arm 80 is pivoted inwardly to engage each latch surface 96 over an end of the edge of the substrate S and mechanically secure the substrate in the insulating member 50 in the loaded position.

The insulating member 50 and the substrate S are readily released from the loaded position by manually flexing the latch arms 18 inwardly, e.g. by pinching a flat 19 on the free end of each latch arm 18 between the thumb and forefinger to disengage latch surface 24 and 108. When the latch surfaces 24, 108 are disengaged, the bowed, resilient contacts 32 engaging the cam surface 56 in each aperture 54 urge the insulating member 50 and substrate S away from housing 10 until latch surfaces 26, 106 engage in the loading position with base 52 spaced the first distance from base 12. The contact arms 36 flex back and each contact surface 42 is disengaged from each conductive pad P on the substrate S. The ends 90 of latch arms 80 are spread to disengage latch surfaces 96. The substrate can be slidably removed from the insulating member 50.

The connector of the present invention is particularly useful for removably mounting daughter cards, e.g. ceramic or other insulated substrates having integrated circuits or other electrical components or devices mounted thereon, on a mother board. The terminals 34 can be inserted in holes in a mother board having conductive pads for interconnecting or terminating the electrical terminals by soldering, e.g. by wave or dip soldering.

What is claimed is:

1. An electrical connector for receiving a substrate having a plurality of conductive pads along a surface adjacent an edge thereof comprising:

a first housing including a base having a pair of upstanding walls forming a channel, a releasable latch arm mounted on each end of the base of said housing, each latch arm including a latching surface extending from a side away from the channel and a latch release member on the free end of each arm, and a latch surface on each end of each wall spaced a distance away from said base and said latch surface on each said latch arm, a plurality of cantilever contacts mounted in said base of said housing extending into said channel, and a member for receiving the substrate operatively mounted in said channel, said member including a base having an aperture receiving each contact and a surface on the base of said member for receiving an edge of the substrate having conductive pads on adjacent surfaces including a latch arm medially mounted on each end of the base of said member, each said arm on said member having a first free end including a first latch surface operatively engageable with said latch surface on one end of each wall of said housing in a loading position in which said member and said housing are engaged for receiving the substrate with zero contact insertion force against the conductive pads, and a second latch surface operatively engageable with said latch surface on one of said releasable latch arms on said housing in a loaded position in which the substrate, said member and said housing are engaged with a graduated force, wiped electrical connection between each contact and each conductive pad.

2. An electrical connector, as recited in claim 1, each said medially mounted latch arm including a second free end and having a latch surface on said second free end for engaging an edge of said substrate away from said base.

3. An electrical connector as recited in claim 1, the base of said member for receiving the substrate, additionally comprising an insulating member extending from said base of said member between each aperture, and a pair of insulating end members at each end of said base, each insulating member including a coplanar, vertical surface spaced from an edge of said base for supporting said substrate vertically with respect to said base.

4. An electrical connector, as recited in claim 3, said latch arms comprising a pair of side members having a medial cross-member connected to a free end of each insulating end member.

5. An electrical connector, as recited in claim 1, said contacts including an outwardly-bowed medial portion and each aperture engaging said outwardly-bowed medial portion away from the base of said housing.

6. An electrical connector, as recited in claim 5, each said aperture including a cam surface operatively engaging each contact.

7. An electrical connector, as recited in claim 1, said channel including a stop member mounted therein for preventing over-riding of the base of said member and said apertures over the outwardly-bowed medial portion of said contact.

* * * * *